(12) United States Patent
Li

(10) Patent No.: US 8,779,804 B2
(45) Date of Patent: Jul. 15, 2014

(54) GATE-STRESS TEST CIRCUIT WITHOUT TEST PAD

(71) Applicant: STMicroelectronics (Shenzhen) R&D Co. Ltd., Shenzhen (CN)

(72) Inventor: Lin Li, Shenzhen (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 0 days.

(21) Appl. No.: 13/708,812

(22) Filed: Dec. 7, 2012

(65) Prior Publication Data

US 2013/0169318 A1 Jul. 4, 2013

(30) Foreign Application Priority Data

Dec. 31, 2011 (CN) .......................... 2011 1 0461952

(51) Int. Cl.
*H03K 3/00* (2006.01)

(52) U.S. Cl.
USPC ...................................... 327/108; 324/762.09

(58) Field of Classification Search
CPC ..................................................... G01R 31/275
USPC ...................................... 327/108; 324/762.09
See application file for complete search history.

(56) References Cited

U.S. PATENT DOCUMENTS

| | | | | |
|---|---|---|---|---|
| 5,068,571 A | * | 11/1991 | Schoofs | 315/205 |
| 5,469,096 A | * | 11/1995 | Nessi et al. | 327/112 |
| 6,356,102 B1 | * | 3/2002 | Klein et al. | 326/27 |
| 6,538,481 B1 | * | 3/2003 | Suetsugu | 327/109 |
| 6,836,173 B1 | * | 12/2004 | Yang | 327/390 |
| 6,940,262 B2 | * | 9/2005 | Dequina et al. | 323/284 |

* cited by examiner

*Primary Examiner* — Kenneth B. Wells
(74) *Attorney, Agent, or Firm* — Hogan Lovells US LLP

(57) ABSTRACT

A high side driver circuit includes a driver stage having an input, an output, a first power terminal and a second power terminal, a transistor having a first power terminal, a second power terminal, and a control terminal coupled to the output of the driver stage, and a switch coupled between the second power terminal of the driver stage and the second power terminal of the transistor.

12 Claims, 6 Drawing Sheets

GATE-STRESS TEST CIRCUIT WITHOUT TEST PAD

RELATED APPLICATION

This application is a translation of and claims the priority benefit of Chinese patent application number 201110461952.X, filed on Dec. 31, 2011, entitled Gate-Stress Test Circuit Without Test Pad, which is hereby incorporated by reference to the maximum extent allowable by law.

FIELD OF THE INVENTION

The present invention is related to driver circuits, and more particularly, to high side driver circuits including a corresponding voltage stress test circuit.

BACKGROUND OF THE INVENTION

In order to achieve automotive grade quality, mixed analog and power products must pass a gate stress test. The purpose of the stress test is to screen random defects located in the gate oxide of the power MOS transistor. The stress test typically requires a dedicated test mode and test pad to control the gate of the MOS transistor.

A typical power product for automotive applications is a buck regulator with boot-strap having an NDMOS transistor as a high side power device. Such a buck regulator with the high side driver and test circuit pad is shown in FIG. 1.

The integrated circuit portion 102 of circuit 100 includes a driver stage 104 for driving the gate of the high side power MOS transistor $M_{HS}$. The gate stress pad 106 is also coupled to the output of the driver stage 104 and the gate of the high side power MOS transistor $M_{HS}$. The driver stage 104 is coupled between the BOOST node and the SBUCK node, and receives the HS input signal. The boost node is coupled to the $V_1$ voltage input through diode $D_2$. The drain of transistor $M_{HS}$ is coupled to the VIN node, and the source of transistor $M_{HS}$ is coupled to the SBUCK node. External to the integrated circuit portion 102, capacitor $C_B$ is coupled between the BOOST and SBUCK nodes and inductor L is coupled between the SBUCK and $V_{OUT}$ nodes. Diode $D_1$ is coupled between the SBUCK node and ground. Capacitor $C_{OUT}$ and resistor $R_{LOAD}$ are both coupled between the $V_{OUT}$ node and ground.

Referring now to FIG. 2, circuit 200 includes further transistor and gate levels of the driver circuit and gate stress test circuit. Driver stage 204, diode $D_2$, gate stress pad 206, transistor $M_{HS}$, and diode 208 correspond to similar elements in FIG. 1. The integrated circuit portion 202 includes further elements including inverter 210 for receiving the gate-stress test signal, inverter 212, OR gate 214, and AND gate 216. The integrated circuit portion 202 further includes transistors $M_1$, $M_2$, $M_3$, $M_4$, and parallel-connected diodes 218, 220, and 222. A resistor $R_1$ is coupled between the gate and source of transistor $M_2$.

In FIG. 2, transistor $M_{HS}$ is a high side NDMOS transistor, transistor M1 is a 3.3V PMOS transistor, transistor $M_2$ is a high voltage PMOS transistor, and transistors $M_3$ and $M_4$ are high voltage NMOS transistors. As before, HS is the high side drive signal.

In the gate stress test mode, the gate-stress test signal is high, and transistors $M_1$, $M_2$, $M_3$ and $M_4$ are all off. The following steps are performed in the test mode:

A first step is the pre-stress leakage measurement. The $V_{IN}$ voltage is raised until the bias circuit and logic can work, forcing $V_{IN}$=SBUCK, forcing the gate-stress pad voltage to be equal to $V_{IN}$+normal $V_{GS}$, and measuring current passing through the gate-stress pad.

A second step is to fully stress transistor $M_{HS}$. The gate-stress pad voltage is raised to a VIN+stress voltage for a predetermined stress duration interval Ts.

A third step is performing a new leakage measurement. The gate-stress pad voltage is decreased to $V_{IN}$+normal $V_G$, and the current passing through the gate-stress pad is measured.

A fourth step is that a nonzero delta leakage is an indication of a possible gate failure.

As one example, a transistor oxide thickness is equal to 7 nm, a normal $V_{GS}$ is equal to 3.3V, a normal stress voltage is 6V, and a normal stress duration interval Ts is between 50 ms and 250 ms.

What is desired is a high side driver for a buck regulator, without a test pad, that will consume less die area, and has a driver stage design that is easy to use in a split power MOS application.

SUMMARY OF THE INVENTION

According to the present invention, a high side driver circuit includes a driver stage having an input, an output, a first power terminal and a second power terminal, a high side power MOS transistor having a first power terminal, a second power terminal, and a control terminal coupled to the output of the driver stage, and a switch coupled between the second power terminal of the driver stage and the second power terminal of the transistor. A diode is coupled between the first power terminal of the driver stage and a voltage source. The switch is controlled by a gate stress control signal.

In a normal operating mode, the switch is opened. In a test mode, the switch is closed. In the test mode a first leakage current measurement at the first power terminal of the driver stage is performed, the power MOS transistor is stressed, and then a second leakage current measurement is performed at the first power terminal of the driver stage.

In a split power MOS embodiment, a plurality of driver circuits and MOS power transistors can be used. Except for a first driver circuit, the additional driver circuits include an input delay circuit. Only one switch is required between the second power terminals of the driver circuits and the second power terminal of all of the MOS power transistors.

DETAILED DESCRIPTION

Figure 1:
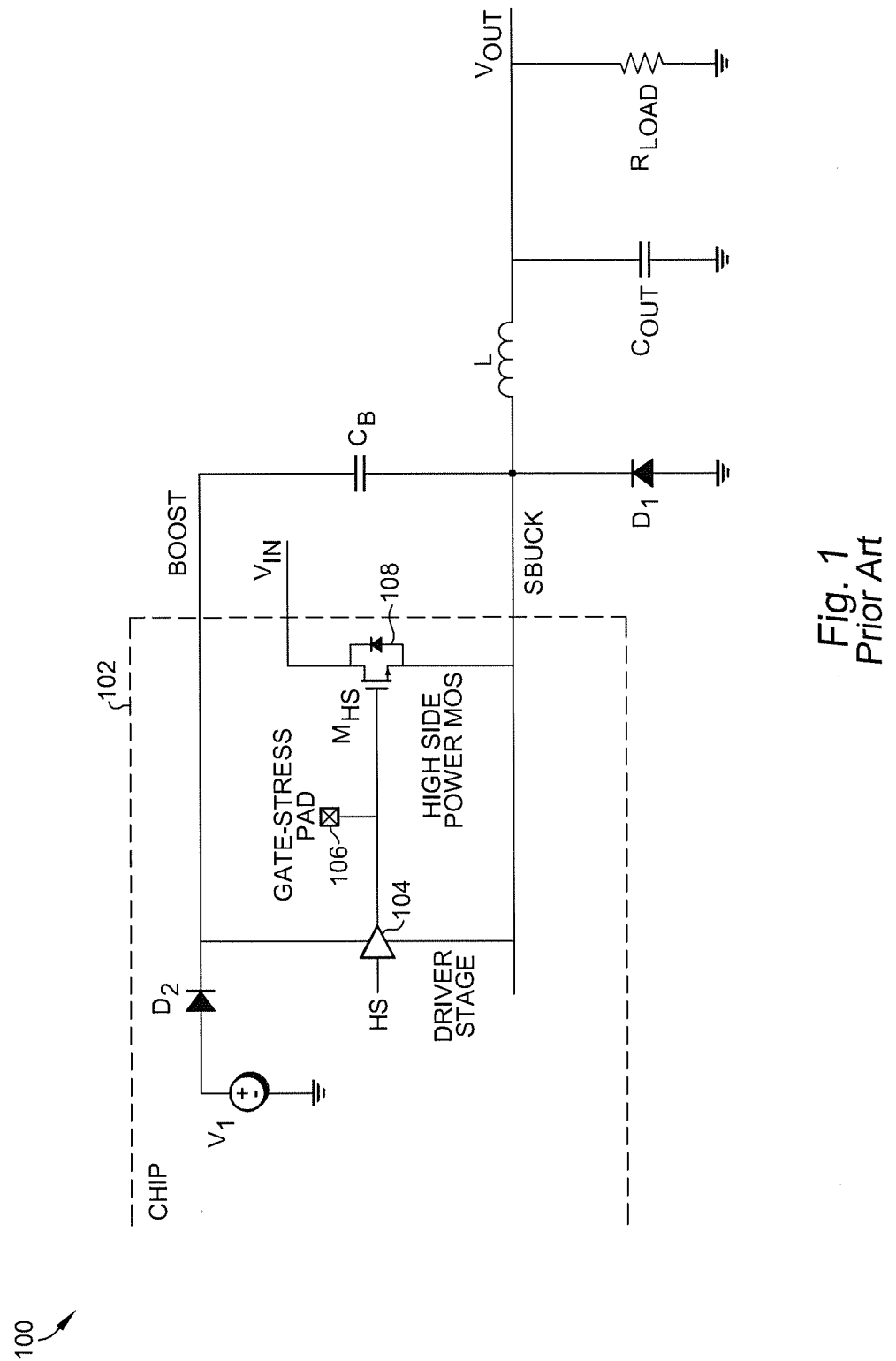
FIG. 1 is a simplified schematic diagram of a buck regulator with bootstrapping and a gate-stress pad according to the prior art.
Figure 2:
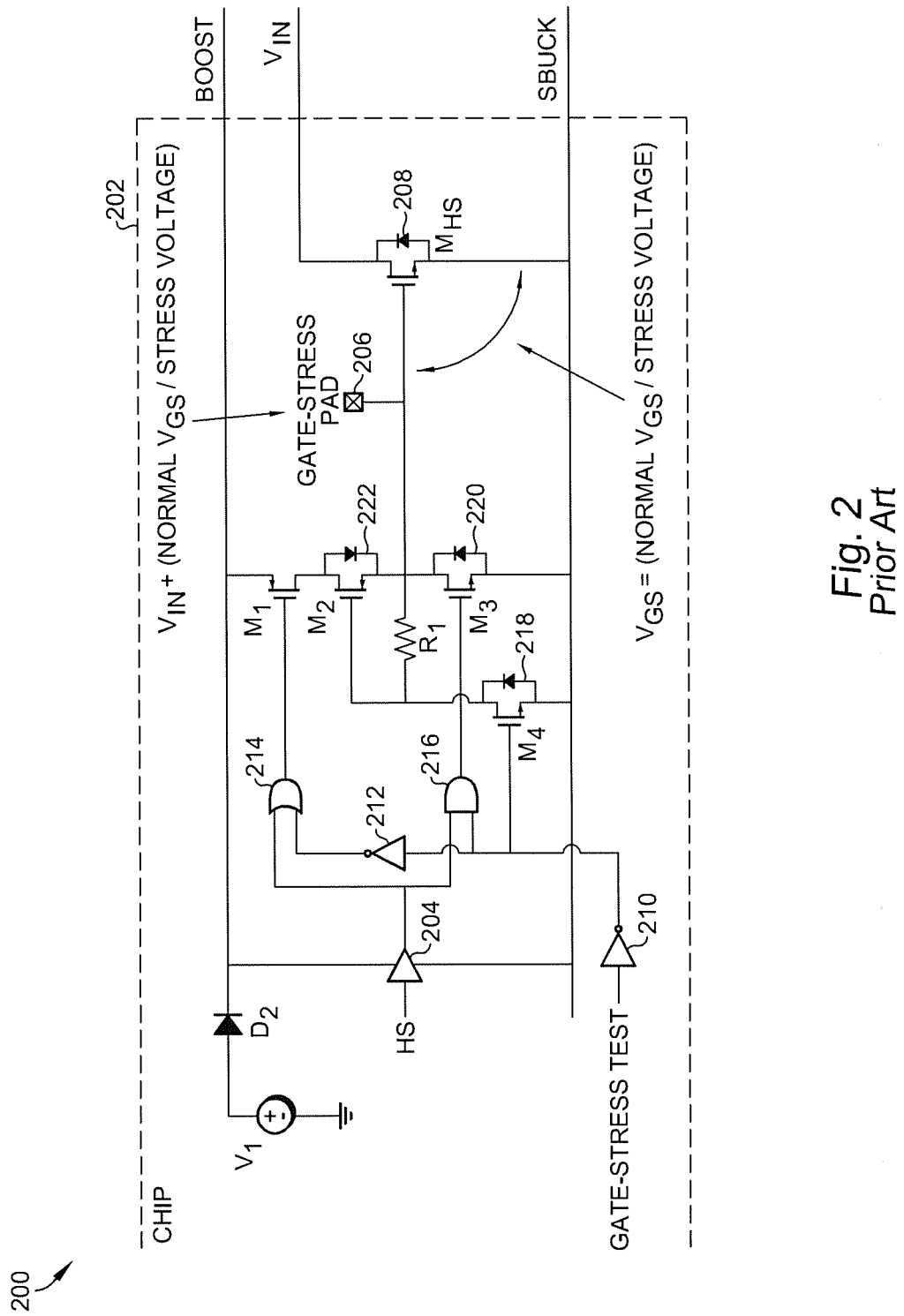
FIG. 2 is a more detailed schematic diagram of the integrated circuit portion of the buck regulator shown in FIG. 1, including the transistor and logic gate implementation of the gate stress test circuit according to the prior art.
Figure 3:
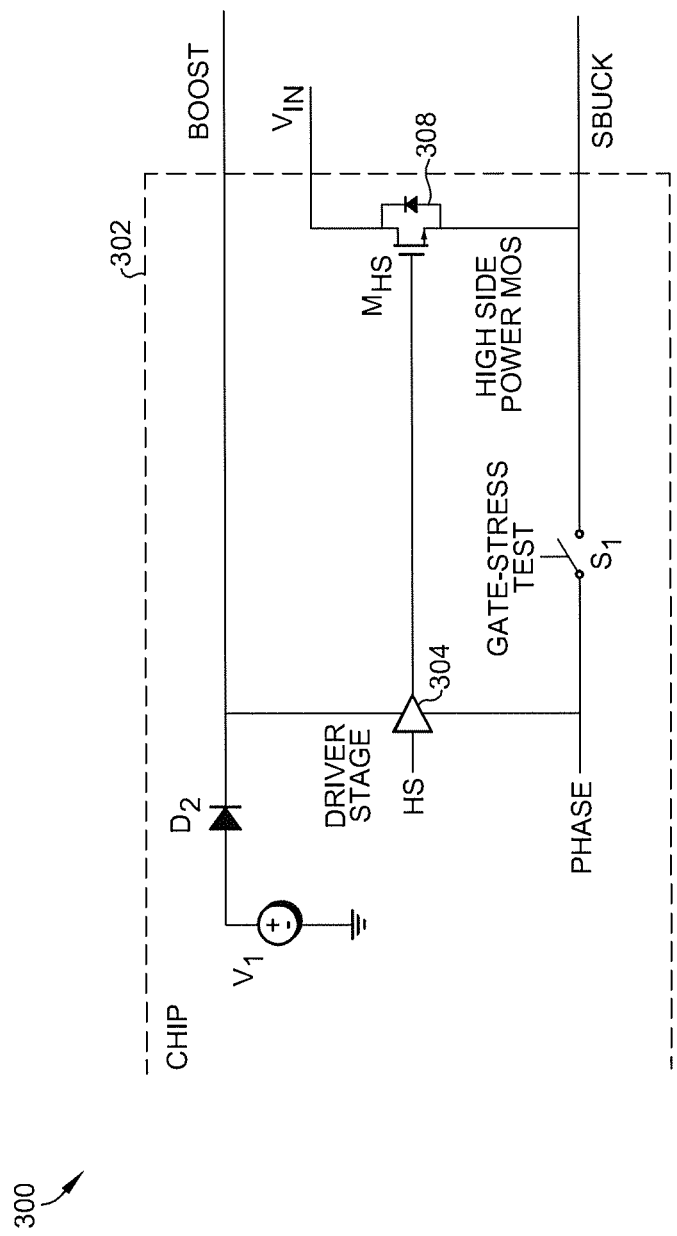
FIG. 3 is a simplified schematic diagram of a high side driver circuit for use in a buck converter, according to the present invention, but without the gate-stress pad shown in the prior art.

According to an embodiment of the present invention, a high side driver circuit with corresponding test circuit 300 is shown in FIG. 3. Circuit 300 includes diode $D_2$, voltage source driver stage 304, high side power MOS transistor $M_{HS}$, and diode 308 associated with the integrated circuit portion 302 as before. Circuit 300 also includes the BOOST, PHASE, and SBUCK nodes as shown. However, also shown in FIG. 3 is a switch $S_1$ that is inserted between the SBUCK and PHASE (high side driver ground) nodes. Note in particular that the gate-stress pad is removed. The BOOST node or pin is used to raise the power MOS gate voltage and driver stage power terminal voltage to the $V_{IN}$+stress voltage. The control node of switch $S_1$ receives a gate-stress control voltage signal as shown.

Figure 4:
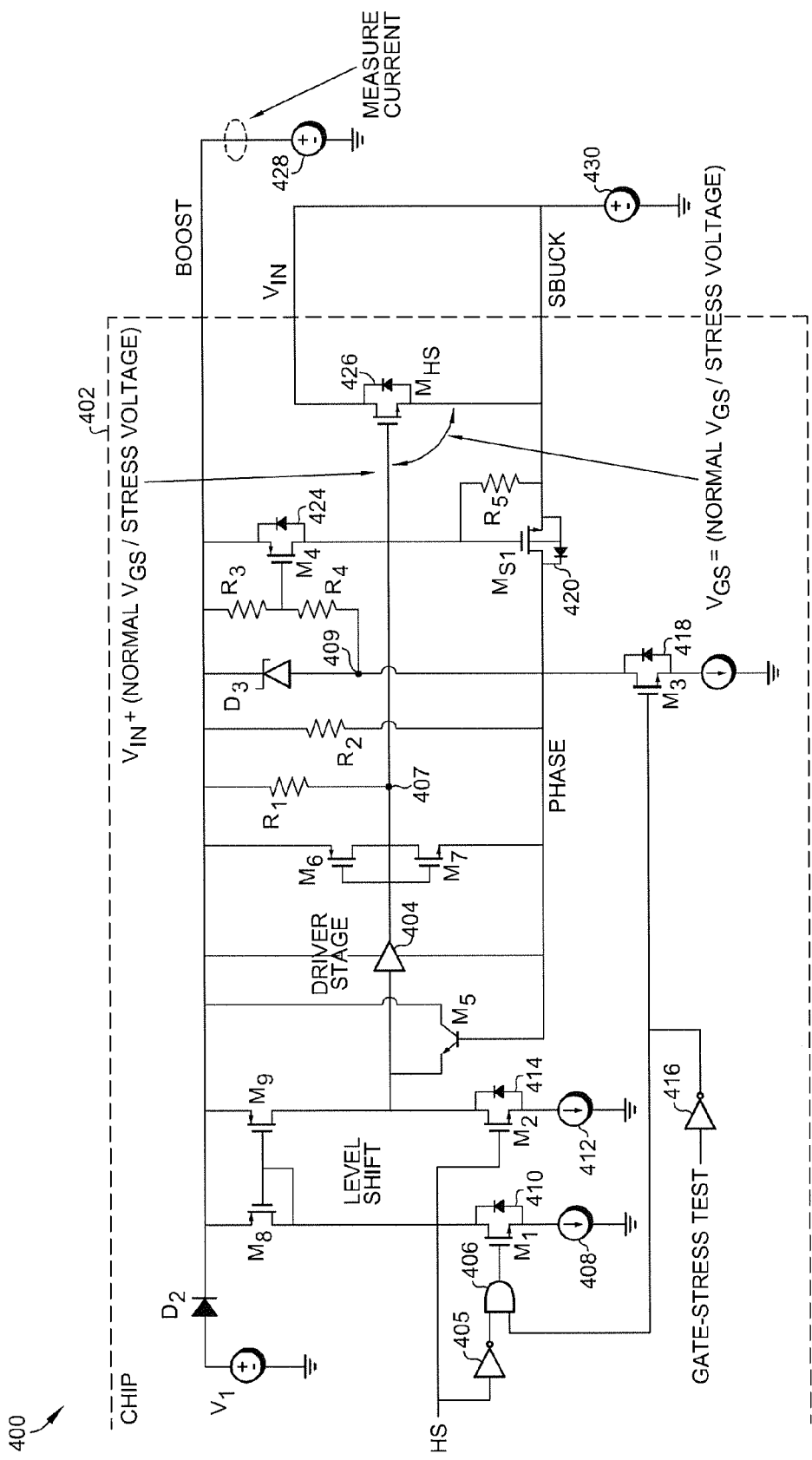
FIG. 4 is a more detailed schematic diagram of the circuit shown in FIG. 3, including a resistor, transistor, and logic gate implementation according to the present invention.

Referring now to FIG. 4, a more detailed transistor level schematic of a circuit 400 is shown that corresponds to the circuit 300 shown in FIG. 3. Transistors $M_1$, $M_2$, $M_3$, $M_4$ and $M_{S1}$ are high voltage DMOS transistors. Circuit 400 includes integrated circuit portion 402, driver stage 404, inverter 405, and NAND gate 406. Transistor $M_1$ includes parallel diode 410 and is coupled to current source 408. Transistor $M_2$ includes parallel diode 414 and is coupled to current source 412. Transistors $M_1$ and $M_2$ are coupled to the P-channel current mirror including transistors $M_8$ and $M_9$. The BOOST node is coupled to the $V_1$ voltage source through diode $D_2$. NPN transistor $M_5$ is coupled between the drain of transistor $M_2$ and the BOOST node, and is controlled by the PHASE signal. Driver stage 404 is coupled between the BOOST and PHASE nodes. Transistors $M_6$ and $M_7$ are also coupled between the BOOST and PHASE nodes. Resistor $R_1$ is coupled between node 407 and the BOOST node. Resistor $R_2$ is coupled between the BOOST and PHASE nodes. Zener diode $D_3$ is coupled between node 409 and the BOOST node. Transistor $M_3$ is coupled between node 409 and the normal VGS stress voltage source. Transistor $M_3$ is controlled by the output of inverter 416, which is in turn controlled by the gate-stress test signal. Resistors $R_3$ and $R_4$ are coupled between the BOOST node and node 409. The gate of transistor $M_4$ is controlled by the center tap of resistors $R_3$ and $R_4$. Transistor $M_4$ includes parallel diode 424. Transistor $M_{S1}$ includes parallel diode 420, as well as parallel-coupled resistor $R_5$. The current through the BOOST node is measured through voltage source 428. A voltage source 430 is coupled to the SBUCK and VIN nodes.

In normal operation mode, gate-stress='0', transistor $M_3$ is turned on, transistor $M_4$ is on, transistor $M_{S1}$ is on, and PHASE=SBUCK.

In the stress test mode, gate-stress test='1', HS='0', and transistors $M_1$, $M_2$, $M_3$, M4 and $M_{S1}$ are off. Since resistors $R_1$ and $R_2$ (500 kΩ) are present, PHASE=BOOST, i.e. all the terminals of the high side driver have the same potential and become floating.

The test steps according to the present invention are:
1. Perform a pre-stress leakage measurement. Raise $V_{IN}$ until the bias circuits and logic circuits are operation. Force BOOST=$V_{IN}$+normal $V_{GS}$, measure pre-leakage current through BOOST. In the ideal condition, this current is zero.
2. Fully stress the transistor. Force BOOST=$V_{IN}$+stress voltage, wherein a stress voltage is applied between the gate and source/drain of the high side NDMOS.
3. Perform a new leakage measurement. Decrease BOOST=$V_{IN}$+normal $V_{GS}$, and at this time measure the current passing through BOOST, to check if there is any leakage. If there is no failure, the leakage current should be zero.

Figure 5:
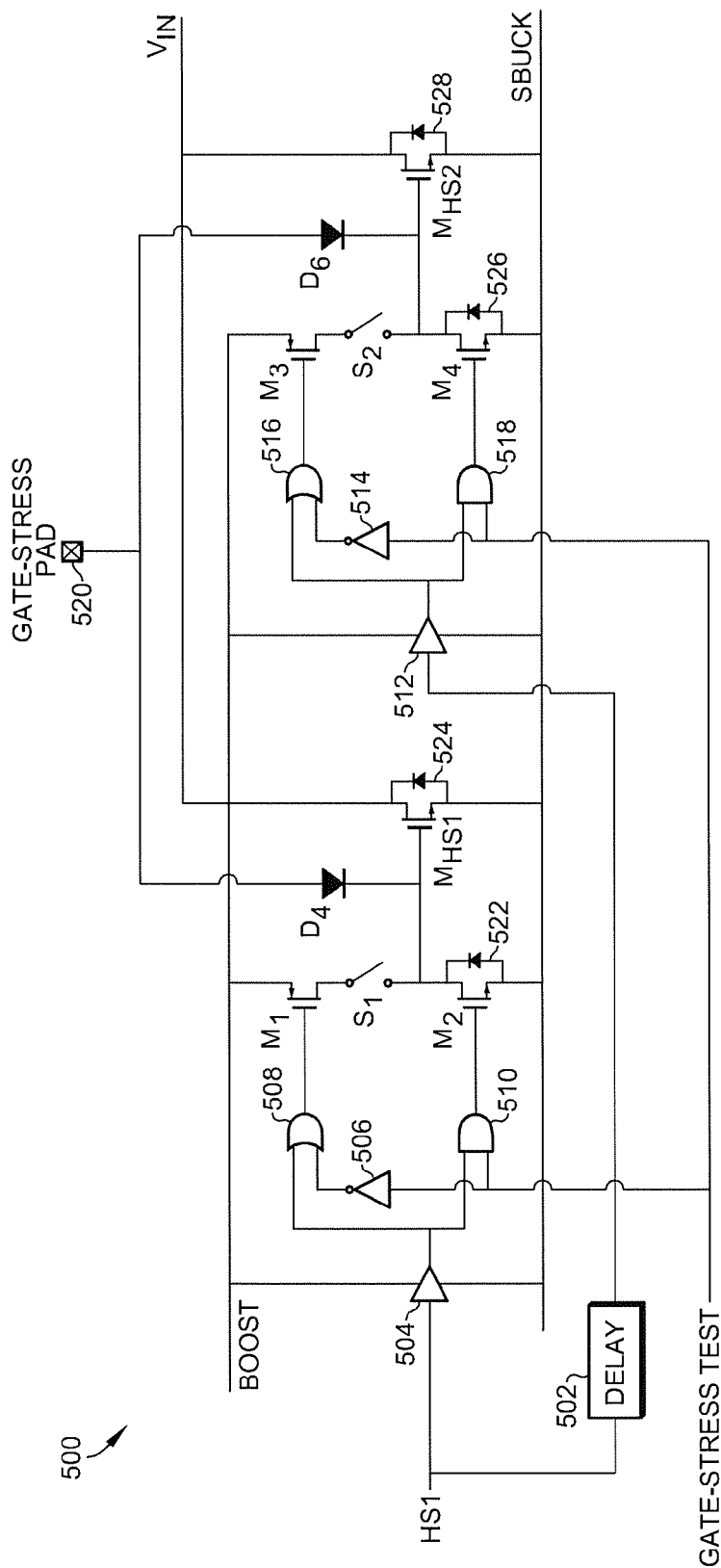
FIG. 5 is a schematic diagram of a gate-stress test circuit with a split high side NDMOS transistor implementation according to the prior art.

Referring now to FIG. 5, a prior art circuit 500 is shown, using a split high side driver and accompanying test circuit. When using a split high side NDMOS, the gate-stress pad 520 should be shared between different DMOS transistors $M_{HS1}$ and $M_{HS2}$ through the insertion of diodes $D_4$ and $D_6$ for each channel. Thus, circuit 500 includes a first portion associated with high side transistor $M_{HS1}$, including driver circuit 504, inverter 506, OR gate 508, AND gate 510, transistor $M_1$, switch $S_1$, transistor $M_2$, diode 522, and diode 524. Circuit 500 includes a second portion associated with high side transistor $M_{HS2}$, including driver circuit 512, inverter 514, OR gate 516, AND gate 518, transistor $M_3$, switch $S_2$, transistor $M_4$, diode 526, and diode 528. Circuit 500 also includes a delay circuit 502. Circuit 500 also includes the HS1 and gate-stress test control signals, the BOOST, $V_{IN}$, and SBUCK nodes.

Figure 6:
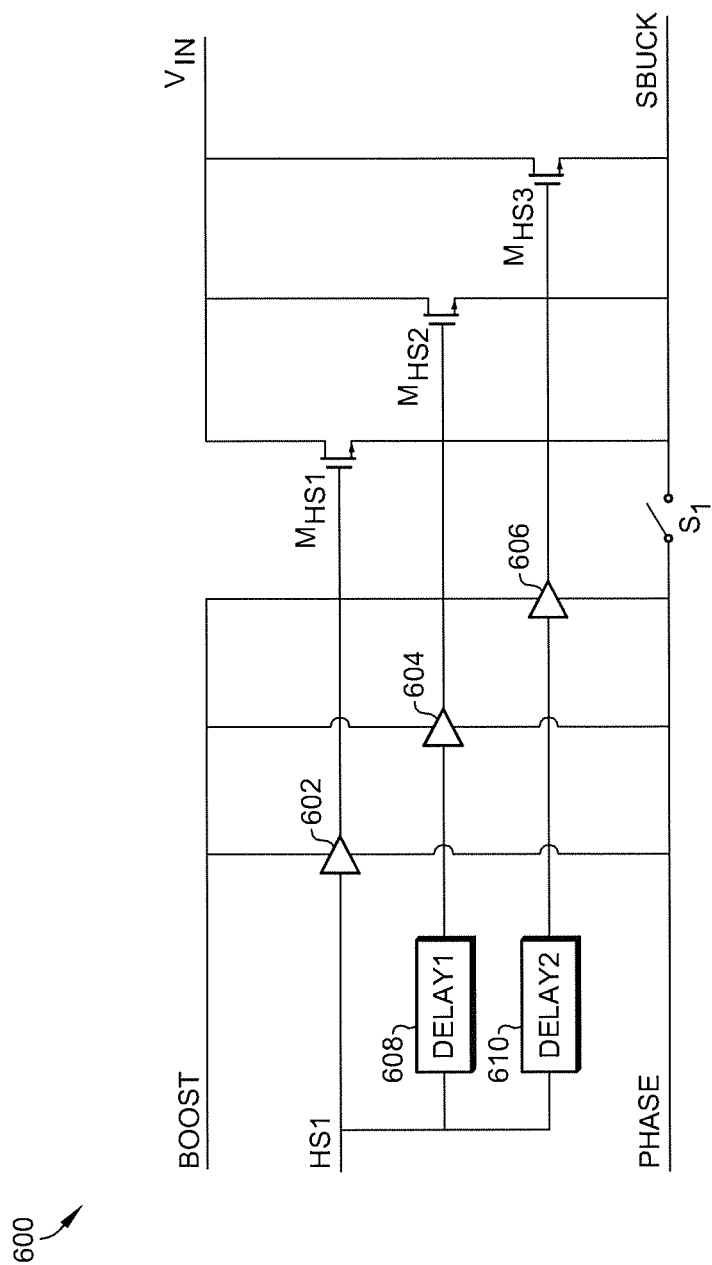
FIG. 6 is a schematic diagram of an embodiment of the present invention directed to a three-way split power transistor implementation according to the present invention.

Referring now to FIG. 6, a split high side gate-stress test circuit and driver circuit 600 does not need any diodes, consumes less die area, and the design of the driver stage is easier than that of the prior art circuit 500 shown in FIG. 5. Circuit 600 includes driver circuits 602, 604, and 606. The power terminals of these driver circuits are coupled between the BOOST and PHASE nodes. The input of driver circuit 602 receives the HS1 input signal, the driver circuit 604 receives the HS1 input signal through delay circuit 608, and the driver circuit 606 receives the HS1 input signal through delay circuit 610. The output of driver circuit 602 drives the gate of transistor MHS1, the output of driver circuit 604 drives the gate of transistor MHS2, and the output of driver 606 drivers the gate of transistor MHS3. The drains of transistors MHS1, MHS2, and MHS3 are coupled to the VIN node, and the sources of transistors MHS1, MHS2, and MHS3 are coupled to the SBUCK node. A single switch S1 is used to couple the PHASE and SBUCK nodes. The operation of switch S1 is substantially the same as previously described with the operation of circuit 3 shown in FIG. 3, for use with the single transistor high side driver embodiment.

While a three-way split is shown in FIG. 6, it will be apparent to those skilled in the art that circuit 600 can be adapted to accommodate any high side driver split from two, to any number of split transistors required for a particular application.

According to the present invention, at least one embodiment of an improved gate-stress test circuit is proposed, that includes the insertion of a switch between the SBUCK node and the driver stage ground (PHASE). This approach consumes less die area, and is very suitable for a split power MOS stage as described above.

Although the present invention has been described in considerable detail with reference to certain preferred embodiments thereof, they are for illustrative purposes, and not for limiting the scope of the present invention. Other variations and modifications are possible and may be readily conceived by one skilled in this art, using the teachings of the present invention. Therefore, it is intended that the present invention cover all such modifications and variations, which should be interpreted to fall within the scope of the following claims and their equivalents.

I claim:
1. A high side driver circuit comprising:
   a driver stage having an input, an output, a first power terminal and a second power terminal;

a transistor having a first power terminal, a second power terminal, and a control terminal coupled to the output of the driver stage; and a switch coupled between the second power terminal of the driver stage and the second power terminal of the transistor, wherein the switch is configured to be closed in a test mode and the high side driver circuit is configured to perform a leakage current measurement at the first power terminal of the driver stage.

2. The high side driver circuit of claim 1 further comprising a diode coupled between the first power terminal of the driver stage and a voltage source.

3. The high side driver circuit of claim 1, wherein the transistor comprises a power MOS transistor.

4. The high side driver circuit of claim 1, wherein the switch is controlled by a gate stress control signal.

5. A method of operating a driver circuit comprising:
providing a driver stage having an input, an output, a first power terminal and a second power terminal;
providing a transistor having a first power terminal, a second power terminal, and a control terminal coupled to the output of the driver stage; and
providing a switch coupled between the second power terminal of the driver stage and the second power terminal of the transistor;
closing the switch in a test mode; and
performing a first leakage current measurement at the first power terminal of the driver stage.

6. The method of claim 5 further comprising, in a normal operating mode, opening the switch.

7. The method of claim 5 further comprising stressing the transistor.

8. The method of claim 7 further comprising performing a second leakage current measurement at the first power terminal of the driver stage.

9. The method of claim 5 further comprising coupling a diode between the first power terminal of the driver stage and a voltage source.

10. The method of claim 5, wherein the transistor comprises a power MOS transistor.

11. The method of claim 5, wherein the switch is controlled by a gate stress control signal.

12. The method of claim 5, wherein the transistor further comprises a parallel-coupled diode.

\* \* \* \* \*